United States Patent [19]

Levola

[11] Patent Number: 5,556,465
[45] Date of Patent: Sep. 17, 1996

[54] SAMPLE TREATMENT APPARATUS FOR USE IN MOLECULAR BEAM EPITAXY

[75] Inventor: Tapani Levola, Turku, Finland

[73] Assignee: DCA Instruments Oy, Turku, Finland

[21] Appl. No.: 305,326

[22] Filed: Sep. 15, 1994

[51] Int. Cl.$^6$ ................................................. C30B 35/00
[52] U.S. Cl. ........................ 117/202; 117/200; 117/201
[58] Field of Search ............................ 117/84, 85, 86, 117/108, 200, 201, 202; 118/712; 437/105; 356/369, 400

[56] References Cited

U.S. PATENT DOCUMENTS

| 5,091,320 | 2/1992 | Aspnes et al. | 117/202 |
| 5,131,752 | 7/1992 | Yu et al. | 356/369 |
| 5,206,706 | 4/1993 | Quinn | 356/400 |
| 5,399,521 | 3/1995 | Celii et al. | 437/105 |

FOREIGN PATENT DOCUMENTS 2035635A  2/1987  Japan .................................... 117/85

Primary Examiner—Felisa C. Garrett
Attorney, Agent, or Firm—Ronald J. Kubovcik

[57] ABSTRACT

A method and apparatus in Molecular Beam Epitaxy (MBE) in order to grow thin films. The substrate is attached to the rotatable manipulator and its normal will be aligned parallel to the rotation axis in vacuum for providing a real time information on the growth parameters by ellipsometry. The apparatus includes a rotatable manipulator head where the substrate is attached to, and aligning elements to align the substrate normal sufficiently parallel to the rotation axis of the manipulator in vacuum.

7 Claims, 3 Drawing Sheets

SAMPLE TREATMENT APPARATUS FOR USE IN MOLECULAR BEAM EPITAXY

FIELD OF THE INVENTION

This invention relates to a method in Molecular Beam Epitaxy (MBE) in order to grow thin films. It also relates to an apparatus used in the said method.

PRIOR ART

Ellipsometry is a very efficient analytical method in MBE for controlling the composition, layer thickness, growth rate and growth conditions of complex structures. This optical method is based on polarization measurements of reflected light from the wafer by varying the wavelength or the angle of incidence. These methods are called Spectroscopic Ellipsometry (SE) and Variable Angle of Incidence Spectroscopic Ellipsometry (VASE), respectively. Ellipsometry is a non-destructive spectroscopic method which has been used recently in in-situ measurements during the semiconductor growth.

To achieve the required alloy and thickness uniformity rotation of the substrate is a necessity. In the present rotating MBE arrangements, however, the spectroscopic ellipsometry method could not be used effectively. The rotation creates a wobble which directly causes inaccuracies in the spectroscopic measurements data. In Molecular Beam Epitaxy the ellipsometric data is very sensitive to the angle of incidence of the measuring light.

Typically when the angle of incidence is 75 degrees an error of 0.1 degree in the angle of incidence corresponds to an error of the order of 5% in the layer thickness. [Maracas, G. N., Edwards, J. L., Shiralagi, K., Choi, K. Y., and Droopad, R. Johs, B. and Woolam, J. A.: In Situ Spectroscopic Ellipsometry in Molecular Beam Epitaxy. (J. Vac. Sci. Technol. A. 10(4), July/August 1992)]

When rotating the wafer the azimutal angle of the wafer must be as constant as possible during the rotation. This demand has been very difficult to fulfil in the present available manipulators. One method to avoid the inaccuracy is to stop the rotation of the substrate during spectroscopic measurements. However, when using this method the homogeneity of the film will be lost. Also the method cannot be used in the production systems where high throughput is required.

To avoid wobble the rotating mechanism can be manufactured to be very accurate. So the wobble of the system caused by the mechanical instability can be even less than 0.001 degree. But loading the substrate to the manipulator typically creates more than 0.1 degree wobble. Even the mounting of the wafers on molybdenium (Mo) blocks is a source for wobble. For example, when a wafer with a diameter of two inches is loaded into a manipulator which has no initial mechanical wobble the misalignment of 0.1 mm at the edge of the wafer will create 0.1 degree wobble.

Therefore great attention must be directed to the careful loading of the substrate. Because the wafers will always be transported in vacuum to the system accurate mounting is very difficult. In most cases the wafer loading accuracy is not better than 0.1 degree.

Another aspect in manipulators is the instability due to thermal expansion. There will be big thermal gradients because the wafer temperature can be as high as 800° C. These gradients create tilting and bending in the manipulator head. They also cause changes in the wafer position.

There has been an obvious need for a mechanically accurate manipulator. However, even though the manipulator can be manufactured to be extremely stable and accurate there will still appear wobble due to the inaccurate mounting of the wafer into the manipulator. In the prior art the inaccuracy of the system can be improved only by aligning the substrate in a vacuum.

SUMMARY OF THE INVENTION

The purpose of this invention is to present a stable and accurate manipulator in a new construction way. According to the invention the substrate attached to the manipulator will be aligned in vacuum when rotated. The invention enables spectroscopic ellipsometry to be used with rotatable manipulators in MBE as a fast analytical technique to provide real time information on the growth parameters.

DESCRIPTION OF THE INVENTION

To obtain a stable and accurate manipulator according to the invention the first principle is to design the manipulator so that the effect of thermal expansion will be minimized. This is done in two ways.

The first way is to make the manipulator symmetrical with respect to the rotation axis. So the temperature changes create only axial movements, no bending or tilting of the manipulator head.

The second way is that the supporting elements of the manipulator head will be manufactured of such materials which have a low thermal expansion coefficient. Among the refractory Ultra High Vacuum (UHV) materials Titanium is one of the best for this purpose. Titanium is also a very light and strong material that will minimize the thermal mass of the mechanism shortening, thus the thermal time constant. Using this principle according to these two ways the manipulator will be stiff and stable. The problem in the inaccuracy, however, caused by the used wafer mounting method is still to be solved.

The second designing principle in the manipulator according to the invention is that the substrate will be aligned in a vacuum even when rotated. This will be done by using a mechanical system for the manipulator head.

According to the first embodiment of the invention the manipulator head will be aligned in a vacuum by mechanical actuators which are linear vacuum motors. When the linear vacuum motors are used there will be an advantage that most of the time the motors will be idling during the operation. Therefore the motors produce only very small amounts of heat into the vacuum chamber. On the other hand the linear vacuum motors will emit impurities and therefore the base pressure in the growth chamber can hardly be maintained below $10^{-10}$ mbar, which level is required for the MBE growth.

The linear vacuum motors are easy to operate and the voltage level needed is low. According to the invention the linear vacuum motors can be used if fast changes in the wafer alignment are not necessary.

According to the second embodiment the manipulator head in the vacuum chamber will be aligned by mechanical actuators which are piezo elements. The piezo elements have some advantages with respect to the linear vacuum motors. The first advantage is that the mechanical structure in the apparatus will be simple and there will not be eroding parts.

The piezo crystals do not produce heat and do not degas while working. They are also very fast in operation and can produce big forces. Time constants of a few milliseconds are possible for the piezos depending on the power supply.

The rotation rate of the manipulator is typically 60 rpm. In such a manipulator the piezo crystals can be used even to compensate the inaccuracies due to surface inequality of the wafer.

One disadvantage of the piezo crystals is that the control voltage needed is of the order of 1000 V. However, the piezo crystals have been used in optical systems for alignment purposes and they have proved to be very reliable. For piezo crystal stacks there are several bonding materials available which are UHV compatible and can stand baking temperatures up to 180° C. A piezo material that has been used in most cases in UHV applications is Lead Zirconate Titanate.

In the manipulator head controlling apparatus according to the invention the needed movements for aligning the manipulator head are of the order of 0.1 mm. This control range will demand that the piezo stack is about 200 mm long. However, there are several ways to reduce the length of the piezo stack. Mechanical amplifiers or bimorf piezos are suitable embodiments for this invention.

For the orientation alignment of the manipulator head the minimum amount of piezo crystal elements needed is two. However, the symmetric arrangement with three piezo elements give better thermal stability. These three piezo elements can push and pull the manipulator head making thus a small tilt of the wafer possible.

According to the third embodiment an even simpler way is to use alignment screws connected to the manipulator head. They can be tuned by using a kind of wobble stick.

Because the mechanical movements in this kind of controlling device are of the order of 0.1 mm it is just enough to mount the manipulator head by using flexible membranes which in the system of x-y-z coordinates allow z(-) movement but are very rigid in x-y-plane. In this embodiment of the invention the high voltage for the piezo elements will be generated outside the vacuum chamber. So the wafer can be aligned as accurately as necessary.

In the control system according to the embodiment the piezo elements rotate with the manipulator head and therefore the voltage for the piezo elements must be transported to the rotating body.

In this application there will be presented two embodiments for transporting the voltage to the piezo elements into the UHV system. The first embodiment for this is to use sliding contacts. That is not presented in the drawings. The second embodiment described in the drawings is to use the ball bearing contacts.

In the preferred embodiment of the invention the monitoring of the wobble is done by using a small laser and observing the movement of the light spot from reflection from the wafer. The signal from position sensitive detector can be fed back to the system in order to orientate the wafer.

The above and other features and advantages of this invention will become better understood by reference to the detailed description that follows, when considered in connection with the accompanying drawings.

DETAILED DESCRIPTION OF PREFERRED EMBODIMENTS

Figure 1:
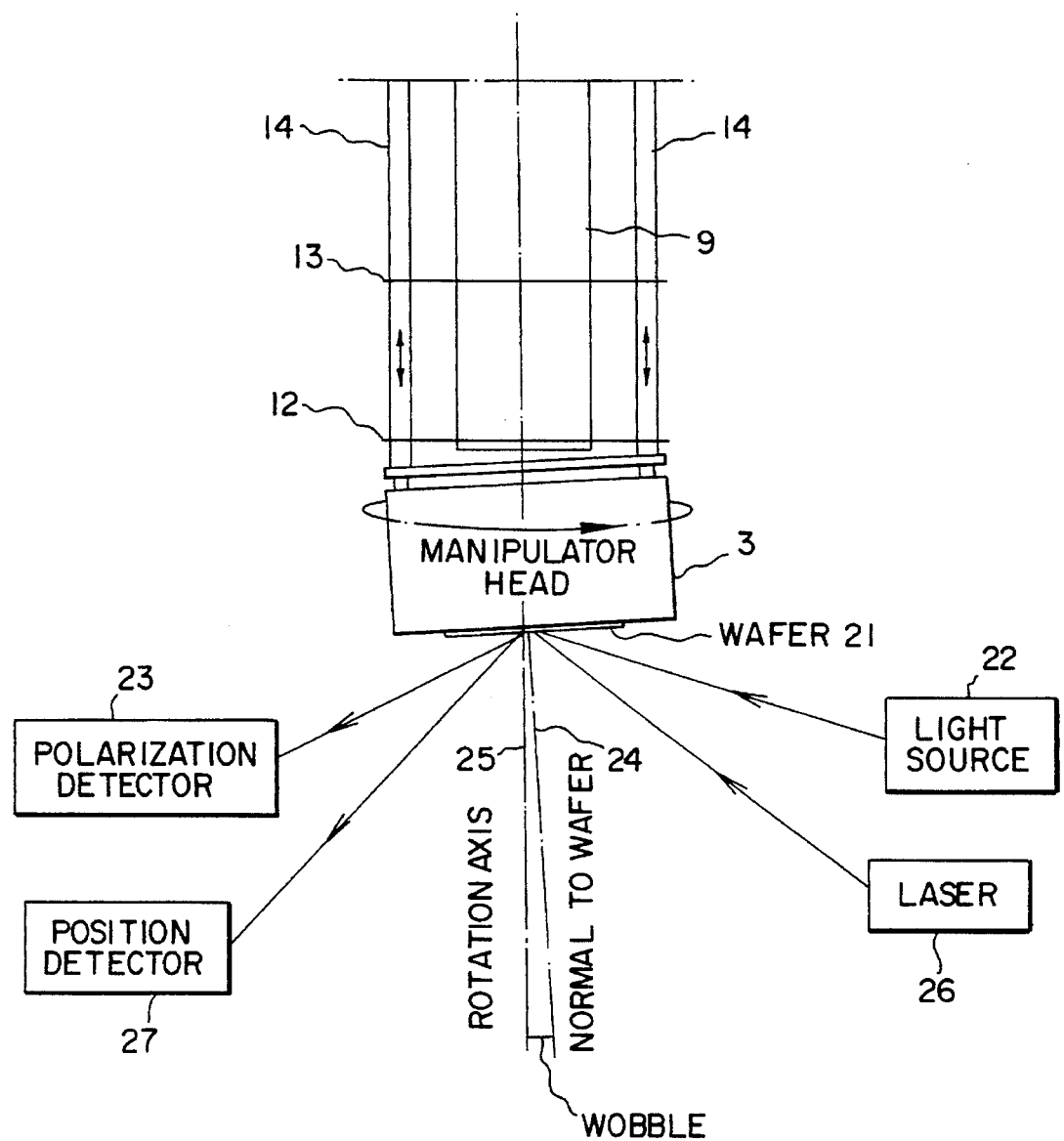
FIG. 1 presents the principle of the spectroscopic ellipsometry in a rotatable manipulator.

In FIG. 1 is presented the principle of the spectroscopic ellipsometry in a rotatable manipulator. The apparatus includes the rotatable manipulator head 3, light source 22 and polarization detector 23 for ellipsometric measurements and laser 26 and position sensitive detector 27 for wobble measurements.

While the manipulator head 3 is rotating the light source 22 emits light to the wafer 21 attached to the manipulator head 3. Generally the reflected light is elliptically polarized and its ellipticity depends on the surface construction and the angle of incidence. The ellipticity of the polarization of the reflected light from the wafer 21 will be observed by the polarization detector 23.

To measure the wobble the reflected laser light 26 from the wafer 21 is used to monitor the wobble with the position sensitive detector 27. The wobble will be identified by an ellipse form curve on the surface of the position sensitive detector 27. The eccentricity of this ellipse is determined by the angle of incidence and its major axis is a measure of wobble. The aim is to minimize the size of this ellipse.

The signal from the position sensitive detector 27 will be fed back to the system in order to orientate the wafer 21. The other embodiment is to combine the light source 22 and the laser 26 and accordingly polarisation detector 23 and position sensitive detector 27 using thus only one light beam.

It can be clearly seen that by monitoring the reflected light the normal 24 to the wafer 21 can be measured. The angle between the rotation axis 25 and the normal 24 to the wafer 21 is the wobble.

Figure 2:
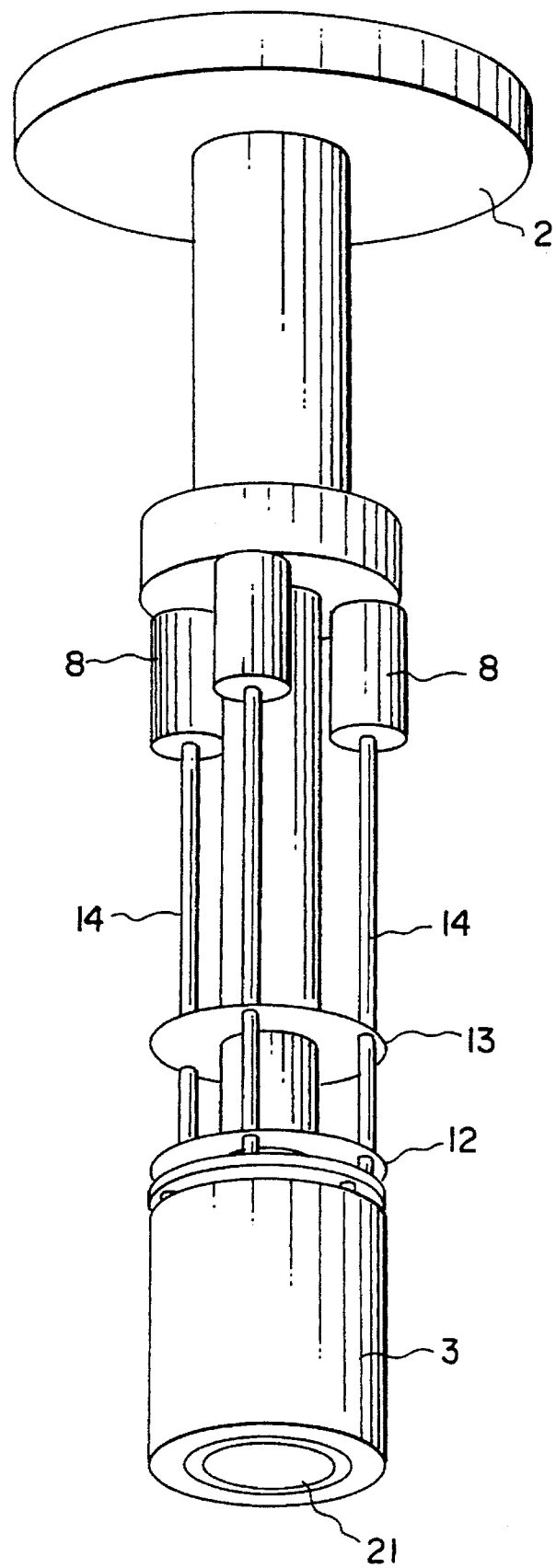
FIG. 2 is a perspective view of a rotatable manipulator according to the invention.

FIG. 2 is a perspective view of a rotatable manipulator according to the invention in which the wafer 21 is attached to the rotatable manipulator head 3. The manipulator head 3 is aligned by three mechanical actuators 8 and alignment rods 14. The mechanical actuators 8 are linear vacuum motors or piezo elements. The alignment rods 14 are supported by two flexible membranes 12 and 13. The manipulator will be mounted to the MBE chamber by the UHV flange 2.

Figure 3:
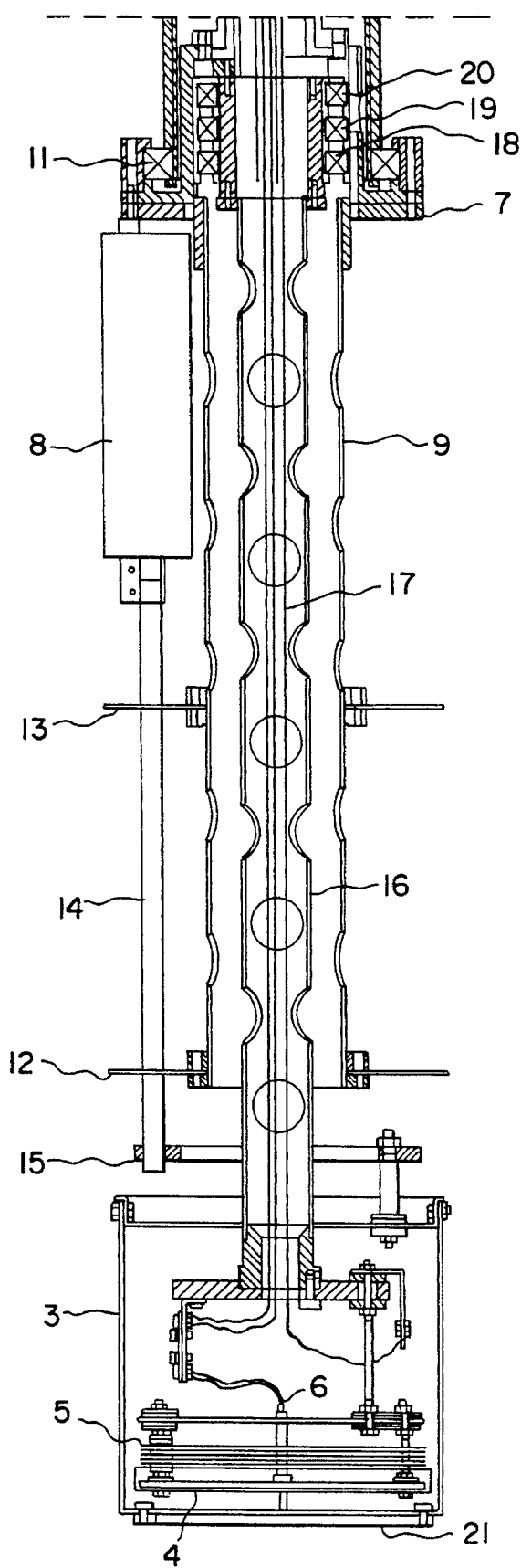
FIG. 3 is a cross section of the rotatable manipulator.

In FIG. 3 is a cross section of the rotatable manipulator according to the invention. The manipulator contains a rotating shaft 1 mounted on the UHV flange 2, manipulator head 3 having necessary heaters 4, heat shields 5 and thermocouples 6, high voltage distributor 7 and three piezo crystals 8. The wafer 21 is mounted in the manipulator head 3 by using Mo-blocks. In the hot part of the manipulator the shaft is a thin walled outer Titanium tube 9 with fittings for inner support bearing 10 and outer support bearing 11. There are also two flexible membranes 12 and 13 for supporting the three alignment rods 14. The alignment rods 14 are connected to manipulator head 3 by using a flexible connection ring 15 which allows small deformations making a small tilt possible.

Inside the shaft 1 in FIG. 3 there is a smaller inner Titanium tube 16 which supports the heater elements 4 inside the rotatable manipulator head 3. Inside inner Titanium tube 16 there are cables 17 for heater 4, thermocouple 5 and piezo elements 8. The voltage distributor 7 has three silver coated contact ball bearings 18, 19 and 20 which are insulated from the body of the manipulator by Aluminium Oxide (ALOX) spacers. There are electrical contacts in the outer and inner bearing rings so that during the rotation there is always galvanic contact from power supply to the piezo crystals 8.

The mechanical actuators 8 in this embodiment are piezo elements which push and pull the alignment rods 14 transferring their movements to the manipulator head 3.

This is the way in which the manipulator head 3 can be tilted about ±0.2 degree which is enough for accurate alignment. The result for the short term of a few minutes stability is about 0.005 degree and the long term of a few hours stability is better than 0.02 degree. If an active stabilisation system is used the stability will always be maintained under 0.01 degree which is sufficient even for sophisticated optical measurements.

I claim:

1. An apparatus for use in Molecular Beam Epitaxy (MBE) in a vacuum in order to grow thin films, wherein the apparatus comprises a rotatable manipulator head adapted for mounting of a substrate, and aligning elements to align an axis normal to the substrate sufficiently parallel to the rotation axis of the manipulator in the vacuum to provide real time information on growth parameters of a layer of said substrate by ellipsometry, such that an angle between said axis normal to the substrate and said rotation axis is 0.2 degrees or less.

2. An apparatus according to claim 1, wherein the apparatus further comprises at least two mechanical actuators for aligning the rotatable manipulator head with the substrate.

3. An apparatus according to claim 2, wherein the mechanical actuators comprise an electrically controllable linear motor.

4. An apparatus according to claim 2, wherein the mechanical actuators comprise an electrically controllable piezo element.

5. An apparatus according to claim 1, further comprising means for minimizing wobble magnitude by adjusting the alignment of the axis normal to the substrate in at least two directions iteratively.

6. An apparatus according to claim 1, wherein the manipulator further comprises a voltage distributor having galvanic contact from outside the vacuum to the rotating mechanical actuators.

7. An apparatus according to claim 6, wherein the voltage distributor has three silver coated contact ball bearings which are insulated from the body of the manipulator.

\* \* \* \* \*